US011137914B2

(12) United States Patent
Sela et al.

(10) Patent No.: US 11,137,914 B2
(45) Date of Patent: Oct. 5, 2021

(54) NON-VOLATILE STORAGE SYSTEM WITH HYBRID COMMAND

(71) Applicant: WESTERN DIGITAL TECHNOLOGIES, INC., San Jose, CA (US)

(72) Inventors: Rotem Sela, Hod Hasharon (IL); Yiftach Tzori, Hod Hasharon (IL)

(73) Assignee: Western Digital Technologies, Inc., San Jose, CA (US)

( * ) Notice: Subject to any disclaimer, the term of this patent is extended or adjusted under 35 U.S.C. 154(b) by 12 days.

(21) Appl. No.: 16/405,818

(22) Filed: May 7, 2019

(65) Prior Publication Data
US 2020/0356280 A1 Nov. 12, 2020

(51) Int. Cl.
*G06F 3/06* (2006.01)
*G11C 11/409* (2006.01)
*G06F 9/38* (2018.01)

(52) U.S. Cl.
CPC ............ *G06F 3/0613* (2013.01); *G06F 3/068* (2013.01); *G06F 3/0655* (2013.01); *G06F 3/0679* (2013.01); *G06F 9/38* (2013.01); *G11C 11/409* (2013.01)

(58) Field of Classification Search
CPC .... G06F 3/0679; G06F 3/0655; G06F 3/0613; G06F 3/068; G06F 9/38; G11C 11/409
USPC ........................................................ 711/154
See application file for complete search history.

(56) References Cited

U.S. PATENT DOCUMENTS

| 6,018,779 | A | 1/2000 | Blumenau |
| 6,345,000 | B1 | 2/2002 | Wong |
| 7,047,374 | B2 | 5/2006 | Sah |
| 7,054,202 | B2 | 5/2006 | Lee |
| 8,589,655 | B2 | 11/2013 | Colgrove |
| 9,021,010 | B1* | 4/2015 | Das .......................... H04L 67/34 709/201 |
| 10,635,317 | B2* | 4/2020 | Kim .................... G06F 13/1663 |
| 2003/0123318 | A1 | 7/2003 | Nagashima |
| 2014/0244907 | A1* | 8/2014 | Watanabe ............. G06F 3/0659 711/103 |

FOREIGN PATENT DOCUMENTS

| CN | 102567241 | 7/2012 |
| EP | 3014453 | 5/2016 |
| GB | 2433627 | 6/2007 |

(Continued)

OTHER PUBLICATIONS

Jeong, et al., "Improving Flash Storage Performance by Caching Address Mapping Table in Host Memory," Presented at USENIX Hotstorage Jul. 11, 2017.

(Continued)

*Primary Examiner* — Hua J Song
(74) *Attorney, Agent, or Firm* — Vierra Magen Marcus LLP

(57) ABSTRACT

A hybrid command is proposed for interacting with a non-volatile memory device. The hybrid command enables a host connected to the non-volatile memory device to both send and receive data using a single command, which removes the need to use separate commands for sending and receiving. Using the one command rather than separate commands increases system performance.

20 Claims, 14 Drawing Sheets

(56) References Cited

FOREIGN PATENT DOCUMENTS

WO 2014/209986 12/2014

OTHER PUBLICATIONS

Jeong, et al., "Improving Flash Storage Performance by Caching Address Mapping Table in Host Memory," S/W Development Team, Memory Business, Samsung Electronics Co., Ltd., Jul. 11, 2017.
Write Combining Memory Implementation Guidelines, Intel, Order No. 244422-001, Nov. 1998.
NVM-Express, Revision 1.3, NVM Express, Inc., May 1, 2017.
NAND (JEDEC Package) Data Sheet, Rev. 1.2, SanDisk Corporation, Jul. 2007.
SD Specifications, Part 1, Physical Layer Simplified Specification, Version 2.00, SD Group (Panasonic, SanDisk, Toshiba) and SD Card Association, Sep. 25, 2006.
SPI Tutorial, Corelis, Inc. Available at: https://www.corelis.com/education/tutorials/spi-tutorial/.
TMS320C672x DSP External Memory Interface (EMIF), User's Guide, Texas Instruments, Feb. 2005, Revised Apr. 2007.
PCT International Search Report dated Mar. 5, 2020, PCT Patent Application No. PCT/US2019/066668.
PCT Written Opinion of the International Searching Authority dated Mar. 5, 2020, PCT Patent Application No. PCT/US2019/066668.

\* cited by examiner

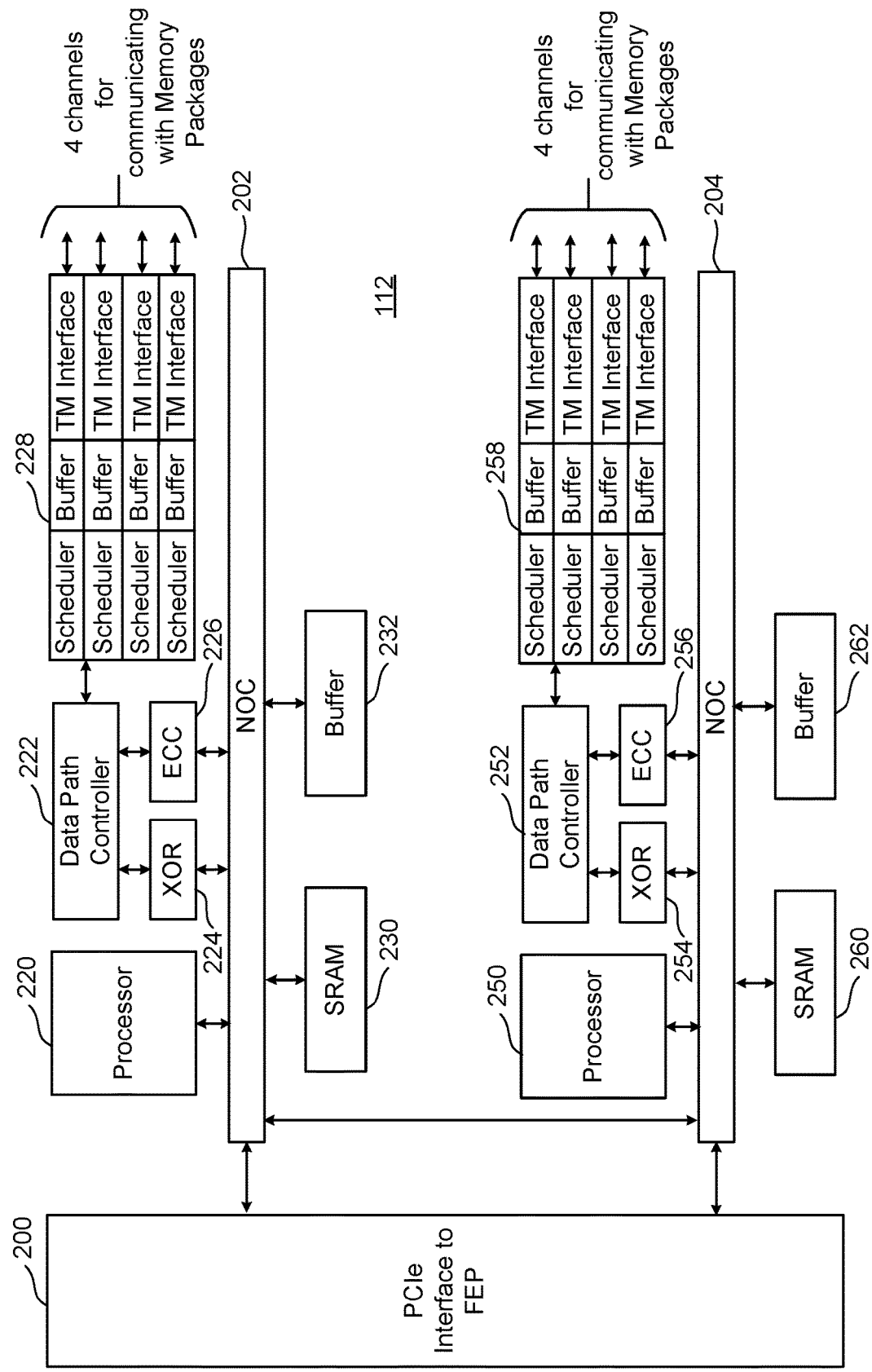

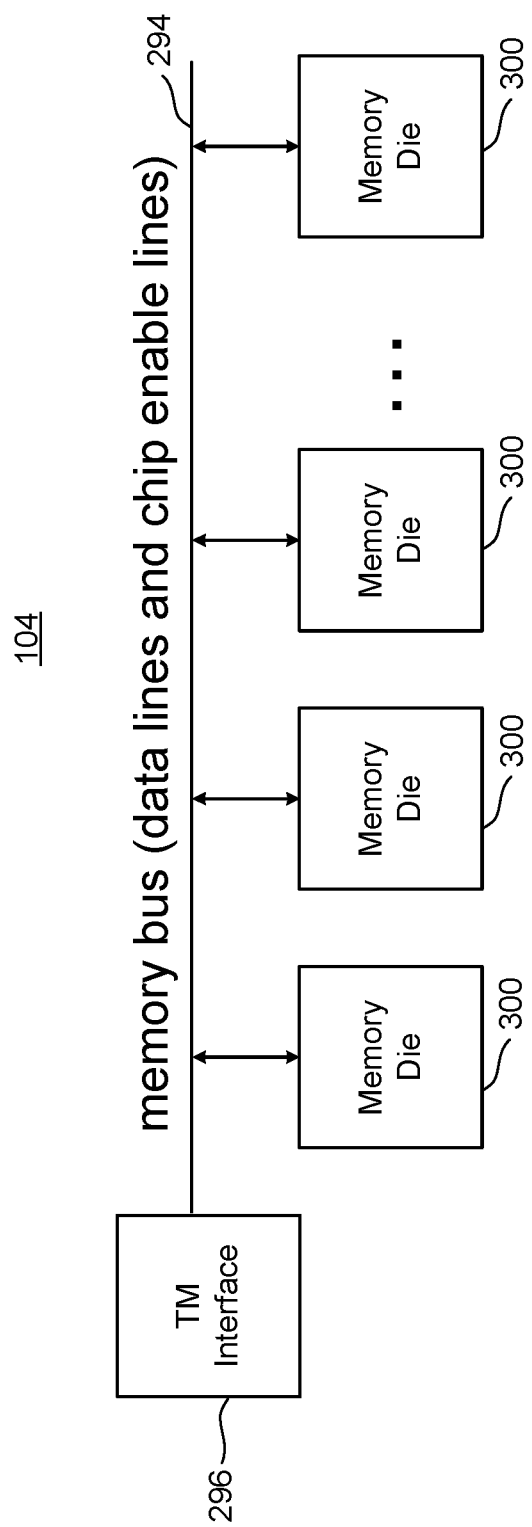

| bit<br>byte | 7 | 6 | 5 | 4 | 3 | 2 | 1 | 0 |
|---|---|---|---|---|---|---|---|---|
| 0 | Operational Code (OP Code) ||||||||
| 1 | Transfer Length: Phase 1 ||||||||
| 2 | Logical Address ||||||||
| 3 |  ||||||||
| 4 |  ||||||||
| 5 |  ||||||||
| 6 | Physical Address Entry ||||||||
| ⋮ |  ||||||||
| 13 |  ||||||||
| 14 | Transfer Length: Phase 1 ||||||||
| 15 | control = 00h ||||||||

Figure 8

| bit<br>byte | 7 | 6 | 5 | 4 | 3 | 2 | 1 | 0 |
|---|---|---|---|---|---|---|---|---|
| 0<br>⋮<br>3 | \multicolumn{8}{c|}{Data Transfer Count} ||||||||
| 4<br>⋮<br>15 | \multicolumn{8}{c|}{reseved} ||||||||
| 16<br>⋮ | \multicolumn{8}{c|}{Data} ||||||||

Figure 9

| bit<br>byte | 7 | 6 | 5 | 4 | 3 | 2 | 1 | 0 |
|---|---|---|---|---|---|---|---|---|
| 0<br>⋮<br>3 | \multicolumn{8}{c|}{Data Transfer Count} ||||||||
| 4<br>⋮<br>31 | \multicolumn{8}{c|}{reseved} ||||||||

Figure 10

| bit<br>byte | 7 | 6 | 5 | 4 | 3 | 2 | 1 | 0 |
|---|---|---|---|---|---|---|---|---|
| 0<br>⋮<br>15 | \multicolumn{8}{c|}{reseved} ||||||||
| 16<br>17 | \multicolumn{8}{c|}{Sense Data Length} ||||||||
| 18<br>⋮ | \multicolumn{8}{c|}{Sense Data} ||||||||

Figure 14

| bit<br>byte | 7 | 6 | 5 | 4 | 3 | 2 | 1 | 0 |
|---|---|---|---|---|---|---|---|---|
| 0 | \multicolumn{8}{c|}{Operational Code (OP Code)} |
| 1 | reserved |
| 2 | Logical Address |
| 3 | |
| 4 | |
| 5 | |
| 6 | reserved |
| 7 | Transfer Length |
| 8 | |
| 9 | control = 00h |

# NON-VOLATILE STORAGE SYSTEM WITH HYBRID COMMAND

BACKGROUND

Many electronic apparatus make use of an embedded or otherwise connected memory device. Often, the embedded or connected memory device includes non-volatile memory. An electronic apparatus that includes an embedded memory device or is connected to an external memory device (or is connected to a memory device) is referred to as a host. Examples of host systems include smartphones, laptops, desktop computers, servers, smart appliances, digital cameras, video cameras, etc.

A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others. One example of a memory device that uses semiconductor based non-volatile memory is a solid state drive.

Users of memory devices, including users of host systems that make use of memory devices, do not want to wait for data to be read or written. Therefore, it is desired that a memory device achieve high performance.

BRIEF DESCRIPTION OF THE DRAWINGS

Like-numbered elements refer to common components in the different figures.

FIG. 1C is a block diagram of one embodiment of a Back End Processor Circuit. In some embodiments, the Back End Processor Circuit is part of a controller.

FIG. 1D is a block diagram of one embodiment of a memory package.

FIG. 8 is a block diagram depicting one embodiment of the format of a data transfer message.

FIG. 9 is a block diagram depicting one embodiment of the format of a ready to transfer message.

FIG. 10 is a block diagram depicting one embodiment of the format of a response message.

FIG. 14 is a block diagram depicting one embodiment of the format of a write command message.

DETAILED DESCRIPTION

A hybrid command is proposed for interacting with a non-volatile memory device. The hybrid command enables a host connected to the non-volatile memory device to both send and receive data using a single command, which removes the need to use separate commands for sending and receiving. Using the one command rather than separate commands increases system performance.

One embodiment for performing a hybrid command for a non-volatile memory device comprises transmitting a command in a command message from a host to a memory device. The command requests an operation to be performed by the memory device. Performance of the command includes sending data in a data transfer message from the host to the memory device in response to the command, sending data in a data transfer message from the memory device to the host in response to the command, the memory device performing the operation in response to the command, and the memory device sending a response message to the host. The data transfer message from the host to the memory device and the data transfer message from the memory device to the host are separate messages from the command message.

Figure 1A:
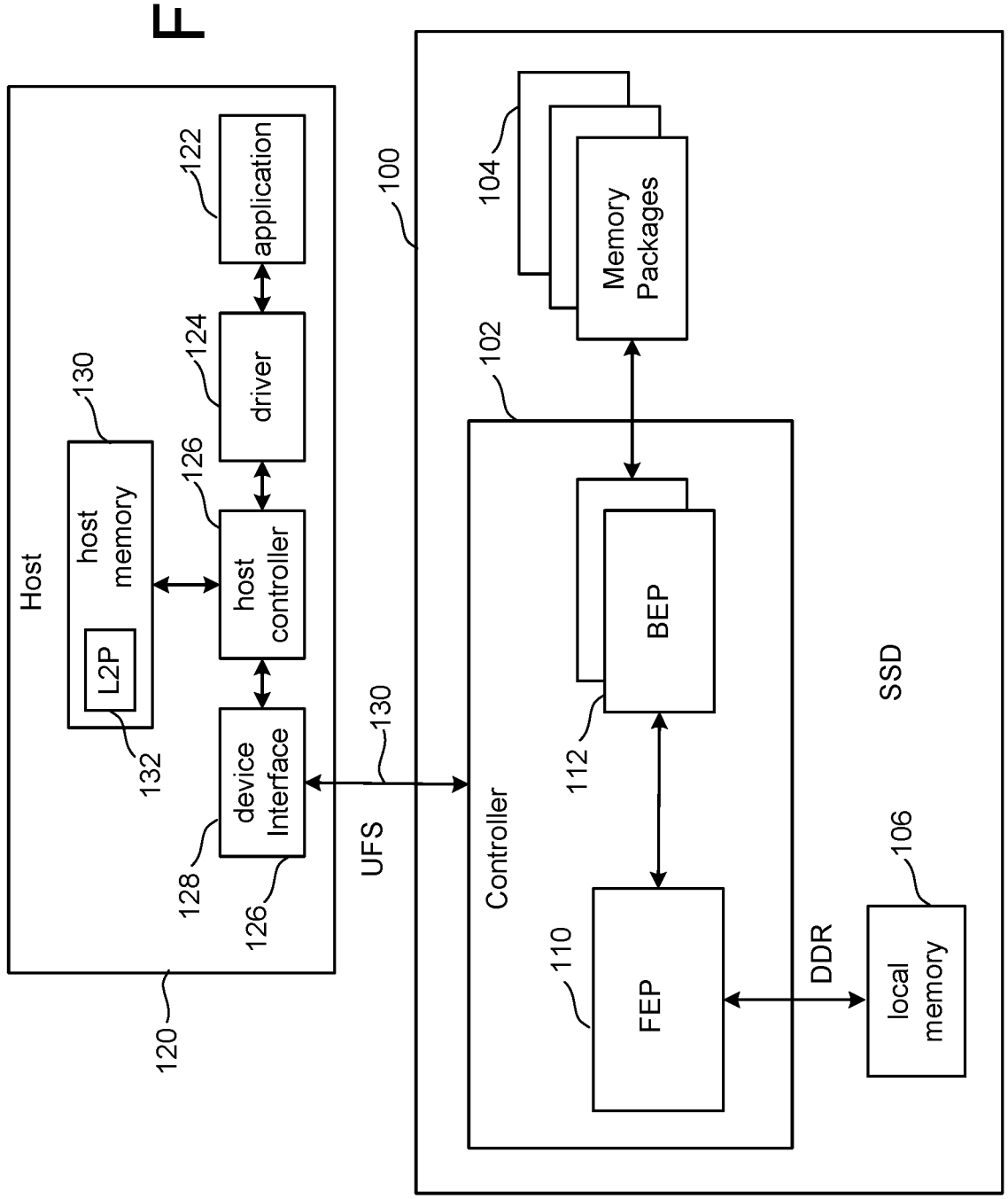
FIG. 1A is a block diagram of one embodiment of a memory device connected to a host.

FIG. 1A is a block diagram of one embodiment of a memory device 100 connected to a host 120 that can implement the technology proposed herein. Many different types of memory devices can be used with the technology proposed herein. One example memory device is a solid state drive ("SSD"); however, other types of memory devices can also be used. Memory device 100 comprises a controller 102, non-volatile memory 104 for storing data, and local memory 106 (e.g. DRAM, SRAM or ReRAM). In one embodiment, controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In one embodiment, the ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (e.g., generate error correction code (ECC)), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 120 via an interface 130. In one embodiment, interface 130 implements a Universal Flash Storage ("UFS") interface. In other embodiments, other types of interfaces can be implemented including (but not limited to) NVM Express (NVMe) over PCI Express (PCIe). Table 1 describes the signals (other than power signals) in one embodiment of interface 130 when a UFS interface is implemented.

TABLE 1

| Signal Name | Type | Description |
| --- | --- | --- |
| REF_CLK | Input | Reference Clock. |
| DIN_t | Input | Downstream lane input. |
| DIN_c | Input | Differential input true and compliment signal pair. |
| DOUT_t | Output | Upstream lane output. |
| DOUT_c | Output | Differential output true and compliment signal pair. |
| RST_n | Input | Reset. |

Host 120 is configured to run a software application 122 that needs to access (e.g., write to and read from) memory device 100. To access memory device 100, application 122 communicates with driver 124, which is software for enabling communication between application 122 and memory device 100. The software implementing drive 124 can be executed by a microprocessor in host 120. Driver 124 is in communication with a host controller 126 (e.g., a microprocessor and software, or other type of processor) that communicates with memory device 100 via device interface 128. In one embodiment, device interface 128 includes a series of connectors, ports capacitors, etc. for physically connecting to memory device 100. Host controller 126 is also connected to host memory 130, which is the host's physical memory and can be DRAM, SRAM, non-volatile memory or another type of storage. Host 120 is external to and separate from memory device 100. In one embodiment, memory device 100 is embedded in host 120. In some embodiments, memory device 100 is not embedded in host 120, but is connected to host 120.

Host 120 is one example of an entity that is external to memory device 100. Other examples of an entity that is external to memory device 100 include other computing devices (e.g., computers, servers, smart appliances, smart phones, etc.) that are connected to memory device 100 and other computing systems that are in communication with memory device 100 via any communication means (e.g., LAN, WAN, WiFi, wired connection, wireless connection, direct connection, indirect connection, etc.)

Figure 1B:
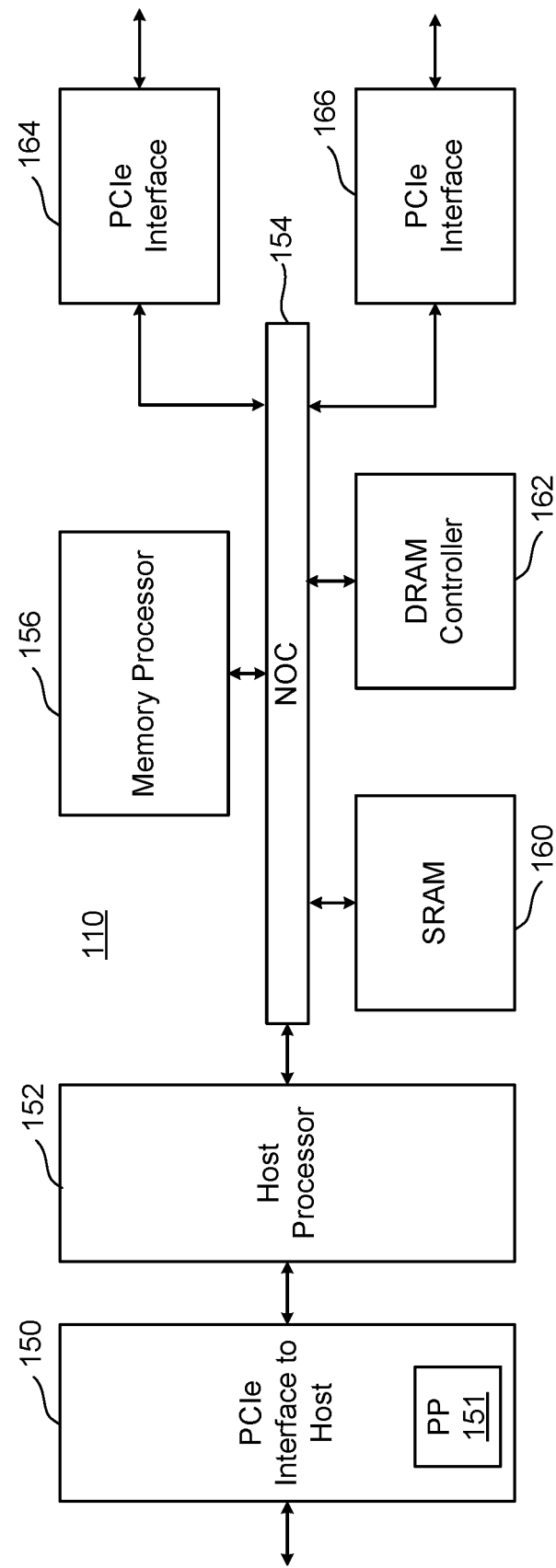
FIG. 1B is a block diagram of one embodiment of a Front End Processor Circuit. In some embodiments, the Front End Processor Circuit is part of a controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is memory processor 156, SRAM 160 and DRAM controller 162. The DRAM controller 162 is used to operate and communicate with the DRAM (e.g., local memory 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art (e.g., encoding data to be written and decoding data that is read). The XOR engines 224/254 are used to XOR the data so that data can be combined (e.g. combine data) and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

FIG. 1D is a block diagram of one embodiment of a memory package 104 that includes a plurality of memory die 300 connected to a memory bus (command lines, data lines and chip enable lines) 294. The memory bus 294 connects to a Toggle Mode Interface 296 for communicating with the TM Interface of a BEP circuit 112 (see e.g. FIG. 1C). In some embodiments, the memory package can include a small controller connected to the memory bus and the TM Interface. The memory package can have one or more memory die. In one embodiment, each memory package includes eight or sixteen memory die; however, other numbers of memory die can also be implemented. The technology described herein is not limited to any particular number of memory die.

FIGS. 1A-D provide one example architecture of a controller. However, the technology described herein is not limited to any specific form of the controller. Therefore, other architectures can be utilized for the controller. For example, other embodiments of a controller include microprocessors, microcontrollers, state machine, etc. in other configurations. In some cases, the controller can be inside the host. In other cases, the controller can be implemented on the memory die. Other options/configurations can also be used. A controller can also be referred to as a processor, even if it includes multiple processing cores, as the controller operates as a processor for the memory device.

Figure 2:
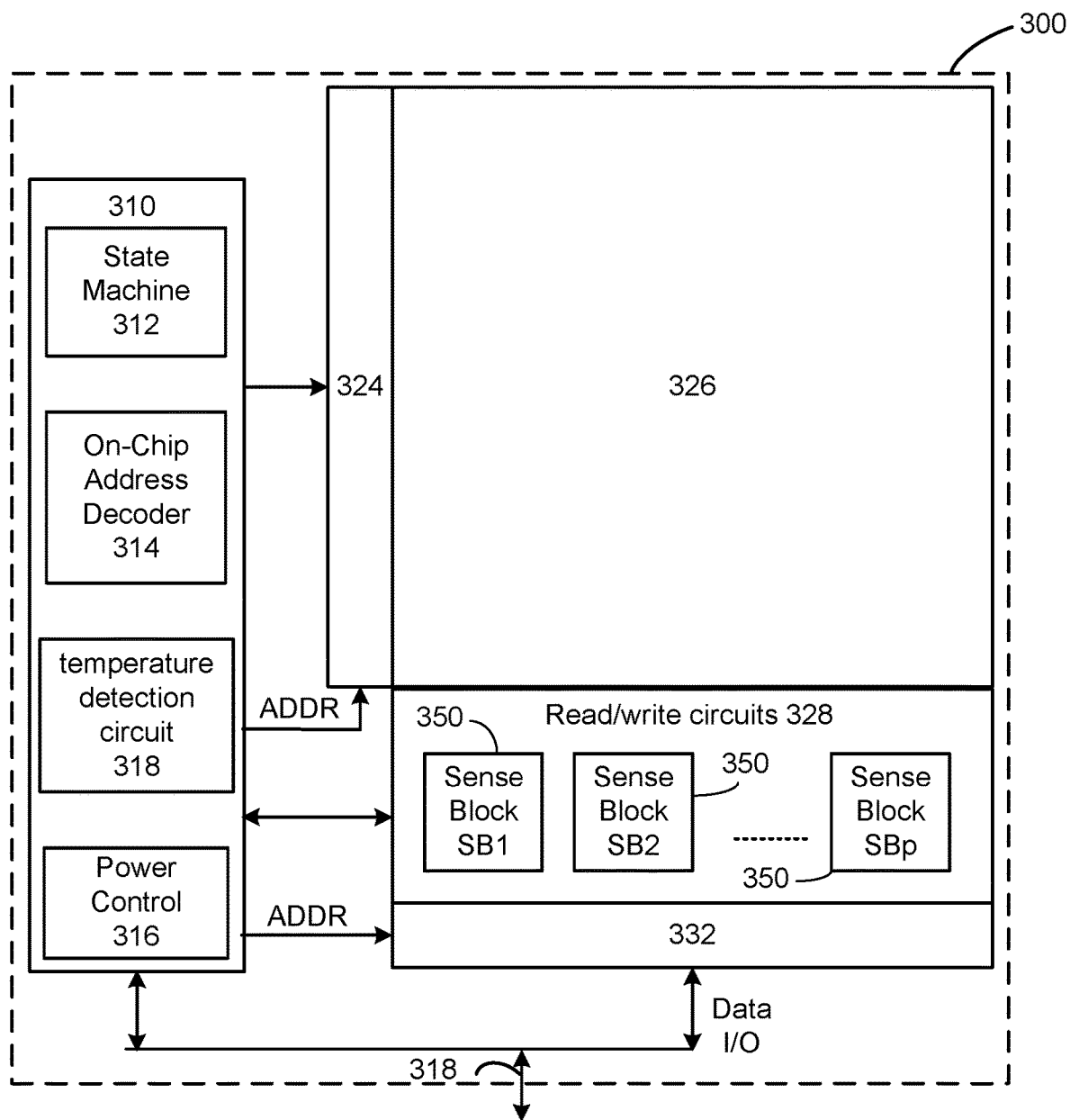
FIG. 2 is a block diagram of one embodiment of a memory die.

FIG. 2 is a functional block diagram of one embodiment of a memory die 300. Each of the one or more memory die 130 of FIG. 1D can be implemented as memory die 300 of FIG. 2. The components depicted in FIG. 2 are electrical circuits. In one embodiment, each memory die 300 includes a memory structure 326, control circuitry 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 102 and the memory die 300 via lines 318. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature detection circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced or augmented by a microcontroller or microprocessor. In one embodiment, control circuitry 310 includes buffers such as registers, ROM fuses and other storage devices for storing default values such as base voltages and other parameters.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise a control circuit connected to memory structure 326. This control circuit is an electrical circuit that performs the functions described below in the flow charts. In other embodiments, the control circuit can consist only of controller 102, which is an electrical circuit in combination with software (e.g., firmware), that performs the functions described below in the flow charts. In another alternative, the control circuit comprises controller 102 and control circuitry 310 performing the functions described below in the flow charts. In another embodiment, the control circuit comprises state machine 312 (and/or a microcontroller and/or microprocessor) alone or in combination with controller 102. In another alternative, the control circuit comprises controller 102, control circuitry 310, read/write circuits 328 and decoders 324/332 performing the functions described below in the flow charts. In other embodiments, the control circuit comprises one or more electrical circuits that operate non-volatile memory.

In one embodiment, memory structure 326 comprises a monolithic three dimensional memory array of non-volatile memory cells in which multiple memory levels are formed above a single substrate. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Performance of a memory device is important. Users do not want to wait for write and read operations to be completed. In some cases, a task may involve host 120 sending data to the memory device and reading data from the memory device. Typically, to send data and read data, the host needs to issue multiple commands. Transmitting, performing and responding to multiple commands elongates the time utilized to complete the task. Therefore, a hybrid command is proposed for use in the interface between the host and the memory device that enables a host connected to the memory device to both send and receive data using a single command, which removes the need to use separate commands for sending and receiving. Using the one command rather than separate commands increases system performance.

Figure 3:
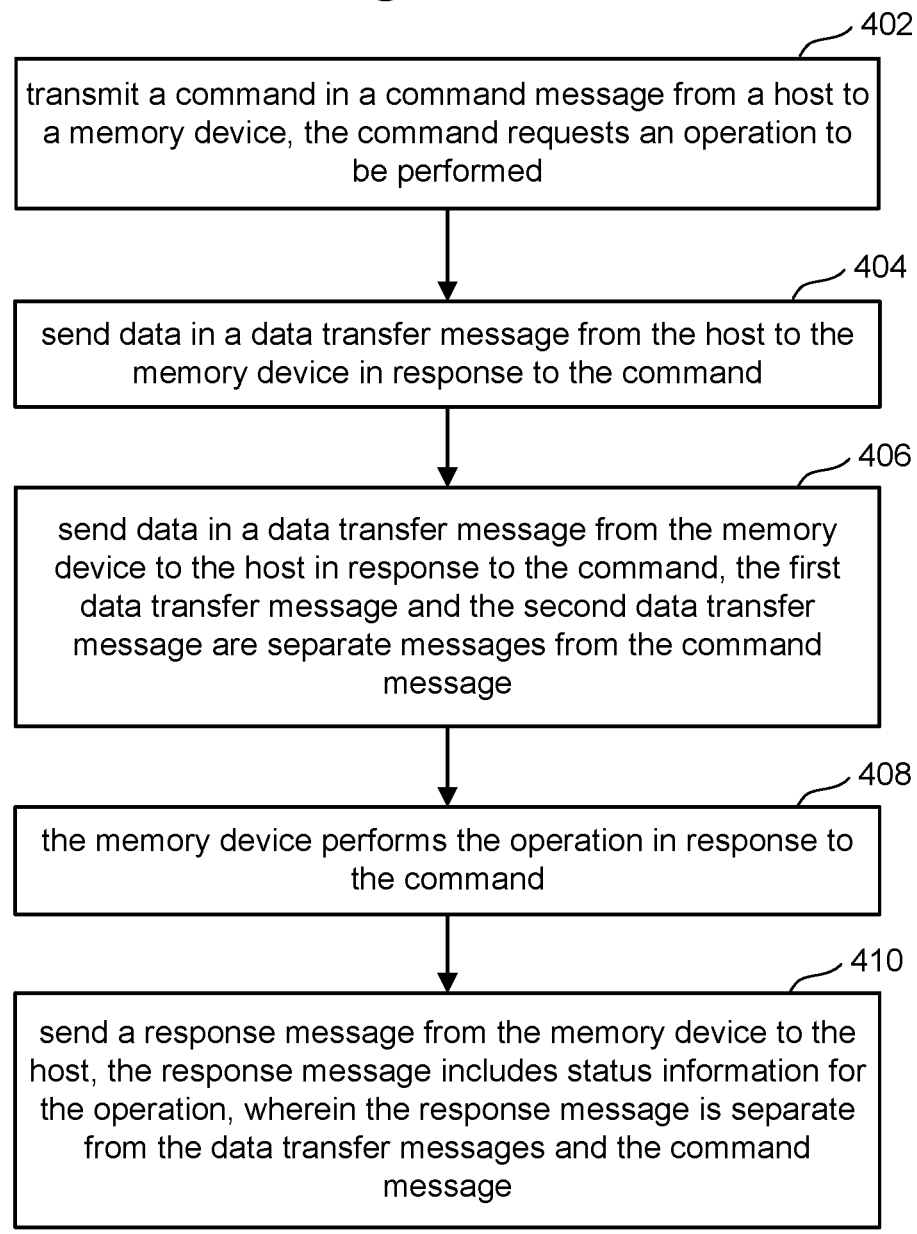
FIG. 3 is a flow chart describing one embodiment of a process for implementing a hybrid command.

FIG. 3 is a flow chart describing one embodiment of a process for implementing a hybrid command. In step 402, host 120 sends a command in a command message to memory device 100. The command requests that an operation (e.g., write, read, etc.) be performed. The command message is sent by host 120 via interface 130 and received by controller 102 of memory device 100. In the example where interface 130 is a UFS interface, then the command message is a Command UFS Protocol Information Unit (UPIU). Although one embodiment includes interface 130 implementing a UFS interface, the process of FIG. 3 also applies to other interfaces different than UFS. In one embodiment, the command message also includes a logical address. The command in the command message is a hybrid command which requires host 120 to send data to memory device 100 and require memory device 100 to send data to host 120. The order of whether the host sends the data first or the memory device sends the data first can vary depending on the particular implementation and the command. In step 404, host 120 sends data in a data transfer message to memory device 100 in response to the command. The data transfer message is received by controller 102 of memory device 100. In the example where interface 130 is a UFS interface, then the data transfer message is a Data Out UPIU. In step 406, memory device 100 sends data in a data transfer message to host 120 in response to the command. In the example where interface 130 is a UFS interface, then the data transfer message is a Data In UPIU. The first data transfer message and the second data transfer message are separate messages from the command message. In step 408, memory device performs the operation in response to the command. For example, if the command is to read a page of data, then step 406 includes controller 120 reading the addressed page of data from non-volatile memory cells in memory packages 104. If the command is to write a page of data, then step 406 includes controller 120 writing the page of data to non-volatile memory cells in memory packages 104. In step 410, memory device 100 sends a response message to host 120. The response message includes status information for the operation performed in step 408. The response message is separate from the data transfer messages of steps 404 and 406, and separate from the command message of step 402. In the example where interface 130 is a UFS interface, then the data transfer message is a Response UPIU. In one embodiment, steps 404-410 comprise performing the command transmitted in step 402.

In one embodiment, host 120 will not send data in step 404 until receiving a prompt from memory device 100. This is because host 120 does not want to send additional data if the memory device is not ready to receive the additional data, because, for example, the memory device might be busy and/or otherwise unable to receive and save the additional data. In the example where interface 130 is a UFS interface, then the prompt is a Ready to Transfer UPIU.

In one embodiment, the data transferred in the data transfer message of steps 404 and 406 are referred to as host data. For purposes of this document, host data is data that was stored on the host at some point prior to being transferred. A subset of host data is user data, which is data that at one time was from a user application (e.g., application 122) and was provided to the host controller 126 for storage in the memory device. An example of user data is a digital photograph taken by a digital camera (host) and stored in a memory card (memory system) connected to the camera. Host data is contrasted with memory system data that was created on the memory system and not yet (or ever) used by the host. An example of memory system data is the status in the response message of step 410.

Figure 4:
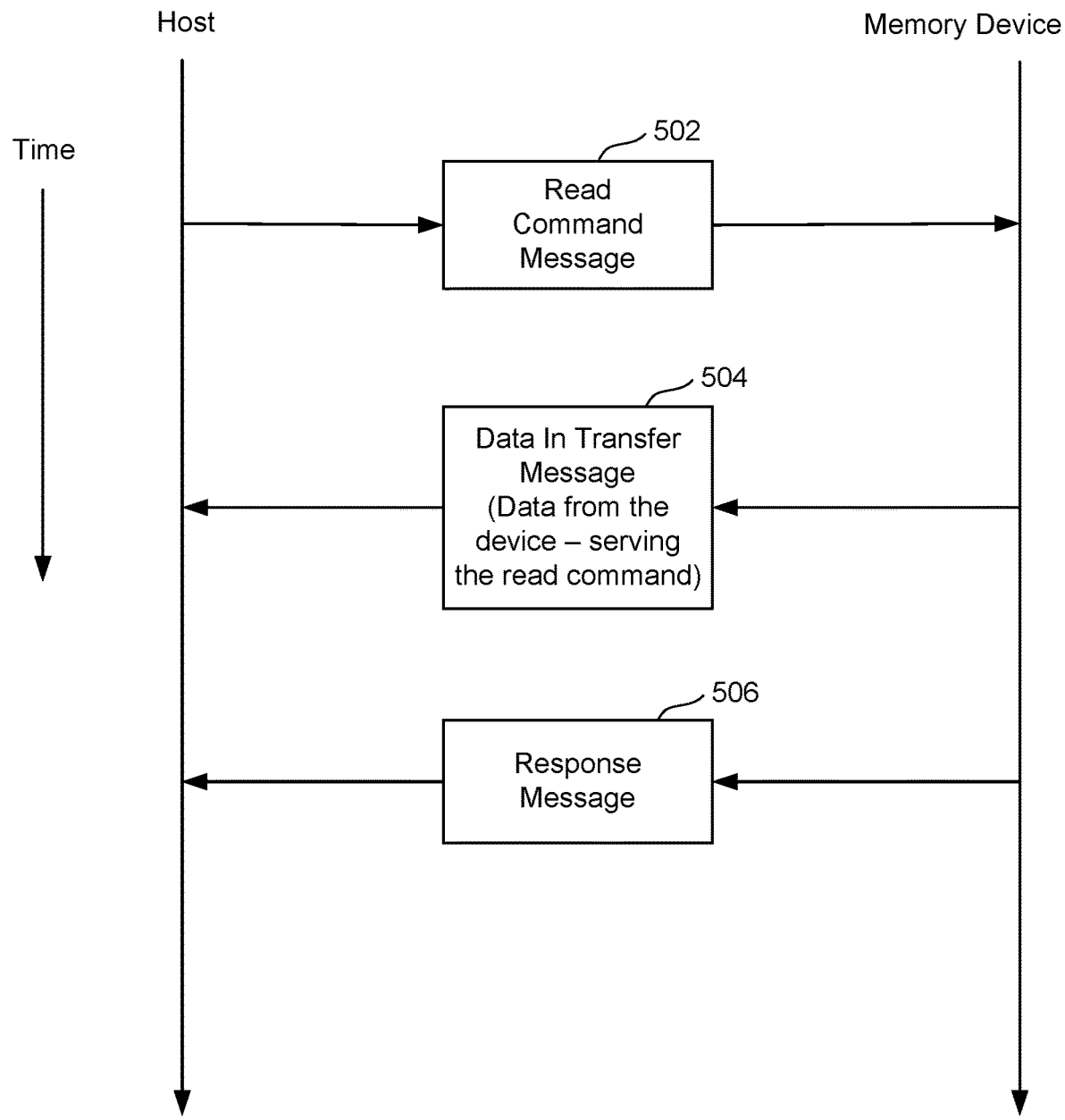
FIG. 4 is a data flow diagram describing the flow of data and messages during a read command.

FIG. 4 is a data flow diagram describing the flow of data and messages between host 120 and memory device 100 during a read command, where the read command is not a hybrid command. First, a Read Command Message 502 is transmitted from host 120 to Memory Device 100. That Read Command Message 502 includes a command to read data. The Read Command Message 502 is received by controller 102, which then performs one or more read operations on the non-volatile memory 104. The data read (i.e. the data read at the memory device—serving the read command) is sent back to host 120 in Data In Transfer Message 504. Subsequently, memory device 100 sends a Response Message 506 to host 120 that includes status information about the performance of the read command. For example, Response Message 506 may indicate that the read process was successful, a failure or had some issues. The flow of FIG. 4 does not include a data transfer message from the host to the memory device, separate from the read command message. Thus, if the host needs to send additional data to the memory device, the host must issue an additional command.

Figure 5:
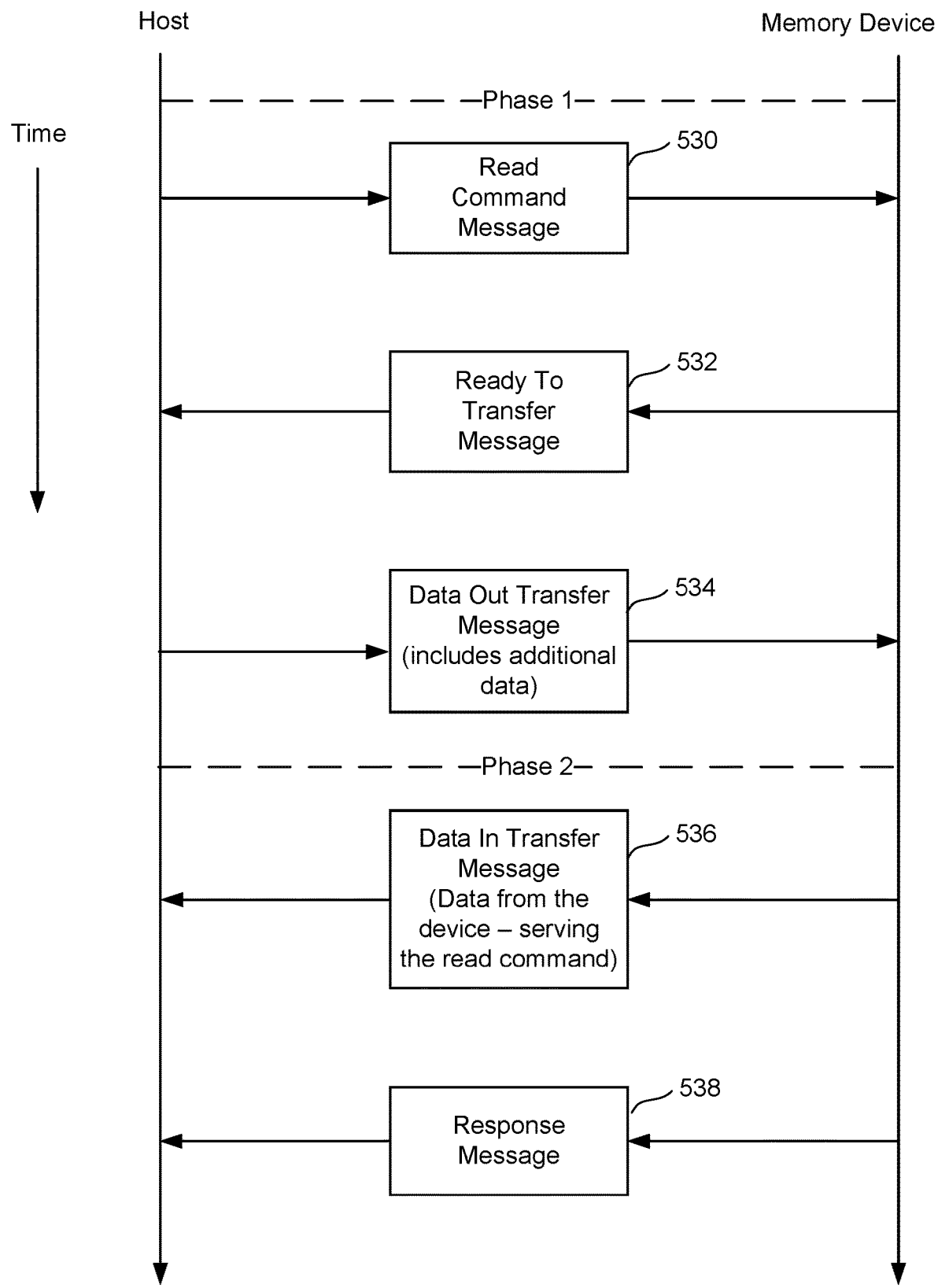
FIG. 5 is a data flow diagram describing one embodiment of the flow of data and messages during a hybrid read command.

FIG. 5 is a data flow diagram describing one embodiment of the flow of data and messages between host 120 and memory device 100 during a hybrid read command. FIG. 5 is one example embodiment representing one example implementation of the process of FIG. 3. FIG. 5 provides an example of the host sending host data to the memory device and receiving host data from the memory device using a single command. The process of FIG. 5 includes two phases. During phase 1, host 120 sends data (e.g., host data) to memory device 100. During phase 2, host 120 receives data (e.g., host data) from memory device 100. All of the messages between host 120 and memory device 100 are sent via interface 130.

Phase 1 starts by host 120 sending a Read Command Message 530 to memory device 100. This is an example of step 402 of FIG. 3. The Read Command Message 530 includes a command to read data, referred to as a read command. The read command is a hybrid command, so it can be referred to as a Hybrid Read Command. The Read Command Message 502 is received by controller 102. Because the read command is a hybrid command, controller 102 knows that it will receive additional data from host 120. When controller 102 (and memory device 100) is ready to receive that additional data, controller 102 (and memory device 100) sends a Ready to Transfer Message 532, indicating to host 120 that memory device is ready for host 120 to send the additional data. In response to receiving Ready to Transfer Message 532, host 102 gathers the additional data and sends that additional data to memory device 100 in a Data Out Transfer Message 534. Thus, Ready to Transfer Message 532 is a prompt to host 102 to send the additional data. Ready to Transfer Message 532 is different than a clock signal that is used to synchronize when to send the data, as Ready to Transfer Message 532 is more like granting permission to send the data, with the exact timing up to the host and a clock signal.

In one embodiment, the additional data may not fit in one Data Out Transfer Message 534; therefore, host 120 may need to send out multiple Data Out Transfer Messages. In one embodiment, Data Out Transfer Message 534 includes a field that indicates that additional Data Out Transfer Messages need to be sent for the current command. Host 120 will wait to send out the additional Data Out Transfer Messages until memory device 100 sends out additional Ready to Transfer Messages, such that each additional Data Out Transfer Message is only sent out after memory device 100 sends out a corresponding additional Ready to Transfer Message. For example, host 120 can send out X Data Out Transfer Messages in response to X Ready to Transfer Messages.

After receiving the additional data, memory device 100 performs one or more read operations. For example, controller 102 instructs the appropriate memory die of memory device 100 to perform sensing operations and send the sensed data to controller 102, which will then decode the data as part of the ECC functionality. The decoded data (the data read from the memory device that is serving the read command) is sent by memory device 100 (e.g., by controller 102) to host 120 in a Data In Transfer Message 536.

After sending the data read, memory device sends a Response Message 538 to host 120. The response message includes status information for the operation, such as whether the read process was successful or failed. Additional status may also be included (e.g., bit error rate, decode time, etc.). As made clear form FIG. 5, Response Message 538, Data In Transfer Message 536, Data Out Transfer Message 534, Ready to Transfer Message 532 and Read Command Message 530 are five separate message sent at different times. Additionally, Response Message 538, Data In Transfer Message 536, Data Out Transfer Message 534, and Ready to Transfer Message 532 are all sent in response to the read command in Read Command Message 530.

FIG. 5 illustrates how the hybrid command provides a mechanism that enables host 120 to send data (e.g., Data Out Transfer Message 534) to memory device 100 and receive data (e.g., Data In Transfer Message 536) from the memory device 100 using a single command (e.g., in Read Command Message 530). The process of FIGS. 3 and 5 can be used with a variety of types of interfaces between the host and memory, a variety of types of hosts, and a variety of types of memory devices.

Figures 6, 7:
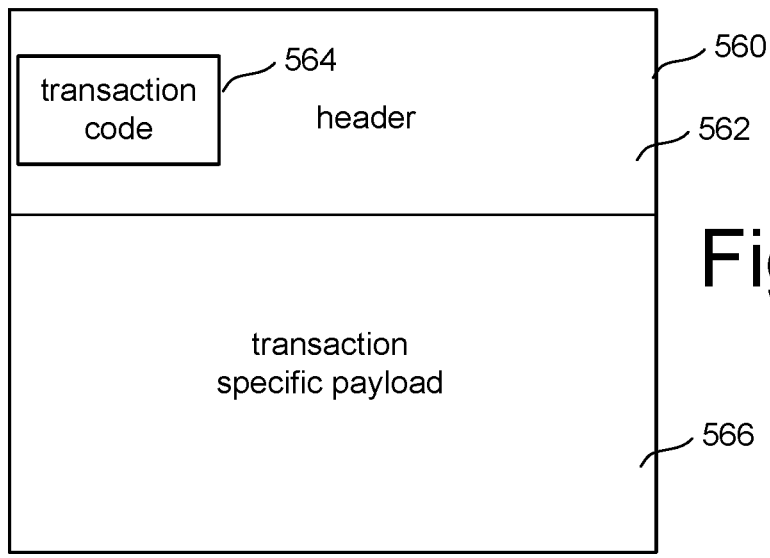
FIG. 6 is a block diagram depicting one embodiment of the format of a message.
FIG. 7 is a block diagram depicting one embodiment of the format of a read command message.

In one embodiment, the process described by FIG. 5 applies to a system that uses a UFS interface between memory device 100 and host 120. In other embodiment, other interfaces can be implemented. In the embodiments that implement a UFS interface between memory device 100 and host 120, all of the messages depicted in FIG. 5 are packets called UFS Protocol Information Units (UPIU). FIG. 6 shows an example format for UFS UPIUs. As depicted, the UPIU 560 consist of a single basic header segment 562, transaction specific fields that comprise a transaction specific payload 566, and possibly one or more extended header segments (not depicted). Header segment 562 has a fixed length of 12 bytes. The minimum UPIU size is 32 bytes which includes a basic header segment 562 and transaction specific payload 566. The maximum UPIU size is defined as being 65600 bytes. Header 562 includes a transaction code 564, which indicates the type of transaction, as well as additional header information. Examples of relevant transactions include Command, Data In, Data Out, Ready To Transfer, Response, and others. The Command transaction originates in the Initiator device and is sent to a Target device. A Command UPIU will contain a Command Descriptor Block as the command and the command parameters. The Data In transaction originates in the Target device and is used to send data from the Target to the Initiator device. The Data Out transaction originates in the Initiator device and is used to send data from the Initiator device to the Target device. The Target device will send a Ready To Transfer transaction when it is ready to receive the next DATA OUT UPIU and has sufficient buffer space to receive the data. The Target device can send multiple Ready To Transfer UPIU if it has buffer space to receive multiple DATA OUT UPIU packets. The Response transaction originates in the Target device and is sent back to the Initiator device. A RESPONSE UPIU will contain a command specific operation status and other response information.

FIG. 7 depicts an example of the transaction specific payload 566 for a Command UPIU. The specific example of FIG. 7 is for a Hybrid Read Command. In one embodiment, the UFS interface implements the Host Performance Booster (HPB) extension. In general, HPB uses the host system's memory as a cache for logical to physical address translation information. In some embodiments, the controller 102 of memory device 100 sends the logical to physical address translation information (e.g., physical addresses, scrambled physical addresses, logical-to-physical (L2P) tables) to the host for storage on the host via one or more UFS UPIUs (e.g., UFS Data In UPIU in response to a Read Buffer command).

In many systems, the non-volatile storage is addressed internally to the memory system using physical addresses associated with the one or more memory die. However, the host system will use logical addresses to address the various memory locations. This enables the host to assign data to consecutive logical addresses, while the memory system is free to store the data as it wishes among the locations of the one or more memory die. To enable this system, the controller performs address translation between the logical addresses used by the host and the physical addresses used by the memory die. One example implementation is to maintain tables referred to as L2P tables (which are one example of logical to physical address translation information) that identify the current translation between logical addresses (such as logical block addresses, known as LBAs) and physical addresses (such as physical block addresses, known as PBAs). An entry in the L2P table may include an identification of a logical address and corresponding physical address.

To run at maximum speed, the L2P tables can be stored in local memory (e.g., DRAM 106) to the controller 102. In some examples, the memory space of a memory system is so large that the local memory cannot hold all of the L2P tables. In such a case, the entire set of L2P tables are stored in the non-volatile storage 104 and a subset of the L2P tables are cached (L2P cache) in the local memory. When a transaction is presented to the controller, the command will include the logical address for the data. If that logical address is in the L2P cache (e.g., cache hit), then performance can be fast. However, if the logical address of the current transaction is not in the L2P cache (e.g., cache miss), then the performance can be degraded.

To remedy the performance degradation from a L2P cache miss, HPB stores portions of the L2P tables in the host memory. For example, FIG. 1 shows L2P tables 132 stored in host memory 130. When the host sends a read command in a Command UPIU, the transaction specific payload 566 of the UPIU will include an Operation Code (Op Code) for an HPB Read, the logical address used by the host 120 and the physical address (from L2P tables 132) used by the memory device 100. This increase performance as time need not be used to fetch the physical address from the L2P tables stored in the non-volatile storage 104.

The HPB READ command delivers the logical address, the physical address and a Transfer Length. In the UFS specification, the Transfer Length is the number of contiguous logical blocks of data that shall be read and transferred. In the current version of the HPB standard, the HPB READ command only supports a 4 KB read (Transfer Length=1). In order to read more than 4 KB of data in a HPB read process, the host 120 needs to provide multiple physical address. However, the current format only provides enough space in the Read Command UPIU for one physical address. Therefore, in order to read more than 4 KB of data in a HPB read process, the host must send multiple read commands (e.g., multiple Command UPIUs), which is not efficient and degrades performance. Therefore, one embodiment of the proposed hybrid command is a hybrid HPB read command that transmits multiple physical addresses for one command so that more than 4 KB of data is read and reported to the host in response to one read command. Looking back at FIG. 5, in this embodiment Read Command Message 530 is a Command UPIU (e.g., a UPIU 560 with a transaction code 564 indicating it is a Command) for which the transaction specific payload 566 indicates that the command is a hybrid HPB read command; the Read To Transfer Message 532 is a Read To Transfer UPIU that indicates that the memory device 100 is ready for the host 120 to send the physical addresses (which are an example of host data because they are stored on the host); the Data Out Transfer Message 534 includes the physical addresses for the data to be read from the non-volatile memory 104 (where the physical addresses can be for blocks, pages or other units); and the Data In Transfer Message includes the data read. Depending on how much data is being read, it may be necessary to break up the data into multiple Data In Transfer Messages (e.g., multiple Data In Transfer UPIUs).

FIG. 7 is depicts one example of the transaction specific payload 566 of the Command UPIU for a hybrid HPB read command (e.g., the transaction specific payload 566 of the Command UPIU for Read Command Message 530). This payload includes an Operational Code (OpCode) for a Hybrid HPB Read (e.g., the OpCode is the read command), the logical address used by the host 120, an optional physical address entry (from L2P tables 132), a Transfer Length: Phase 1, and a Transfer Length: Phase 2. When used, the optional physical address entry specifies the first physical location to read so that the memory device can start the read process while it is waiting for the remaining physical addresses. In some embodiments, it is not necessary to include a physical address entry in the Command UPIU for a hybrid HPB read command. FIG. 7 uses the term "Physical Address Entry" because that field can store an actual physical address or a scrambled version of the physicals address. Some systems have the memory device scramble the physical addresses for security purposes so that if a message is improperly read at the interface by an entity other than memory device 100, the physical address is scrambled and not useful to that other entity. Transfer Length: Phase 1 indicates the amount data to be transmitted during phase 1 of performing the hybrid HPB read command. For example, Transfer Length: Phase 1 indicates how much data (e.g., how many physical addresses) will be transferred in Data Out Transfer Message 534. Transfer Length: Phase 2 indicates the amount data to be transmitted during phase 2 of performing the hybrid HPB read command. For example, Transfer Length: Phase 2 indicates how much data will be read from the memory device and transferred in Data In Transfer Message 536. In another embodiment, the Command UPIU for a hybrid HPB read command will only have on Transfer Length, which will indicate the number of contiguous logical blocks of data to be read.

FIG. 8 depicts one example of the transaction specific payload 566 of the UPIU for Data Out Transfer Message 534 (Data Out UPIU) and for Data In Transfer Message 536 (Data In UPIU). The payload includes a Data Transfer Count and Data. The Data Transfer Count indicate the number of bytes being transferred. This value is the number of bytes that are contained within the Data Segment of the UPIU. The maximum number of bytes that can be transferred within a single UPIU is 65535 bytes. Therefore, multiple UPIU messages will need to be issued if the expected Data Transfer Length of the original command requires more than 65535 bytes to be transferred. The Data segment contains the data payload (e.g., storing physical addresses for Data Out, data read for Data In, etc.).

FIG. 9 depicts one example of the transaction specific payload 566 of the Ready To Transfer UPIU for Ready To Transfer Message 532. The payload includes a Data Transfer Count. The Ready To Transfer UPIU is issued by the Target device when it is ready to receive data blocks (e.g., for a write command or a hybrid read command). The Data Transfer Count indicates the number of bytes that the Target device (e.g., memory device 100) is requesting. In some embodiments, the command will indicate the total number of bytes that the Initiator (e.g., host 120) needs to send. In some embodiments, it is not necessary to indicate the number of bytes that the Target device is requesting.

FIG. 10 depicts one example of the transaction specific payload 566 of the Response UPIU for Response Message 538. The payload includes a Sense Data Length and Sense Data. The Sense Data fields will contain additional information on error condition. The Sense Data Length field indicates the number of valid Sense Data bytes that follow. A successfully executed command will not normally need to return Sense Data; therefore, in this case the Data Segment area may be empty (which is an indication of a result) and the Data Segment Length may have a zero value. A command that terminated in error or an exception may or may not return Sense Data. If the Sense Data Length indicates a value of zero, then that error condition did not return Sense Data. A zero value in the Data Segment Length also indicates that no Sense Data was returned. Otherwise, the Sense Data Length will contain a value that indicates the number of additional bytes of Sense Data information. In addition, the header for the Response UPIU can include a set of status flags to indicate status of the command. In some embodiments, the Sense Data will be SCSI fixed format sense data.

Figure 11:
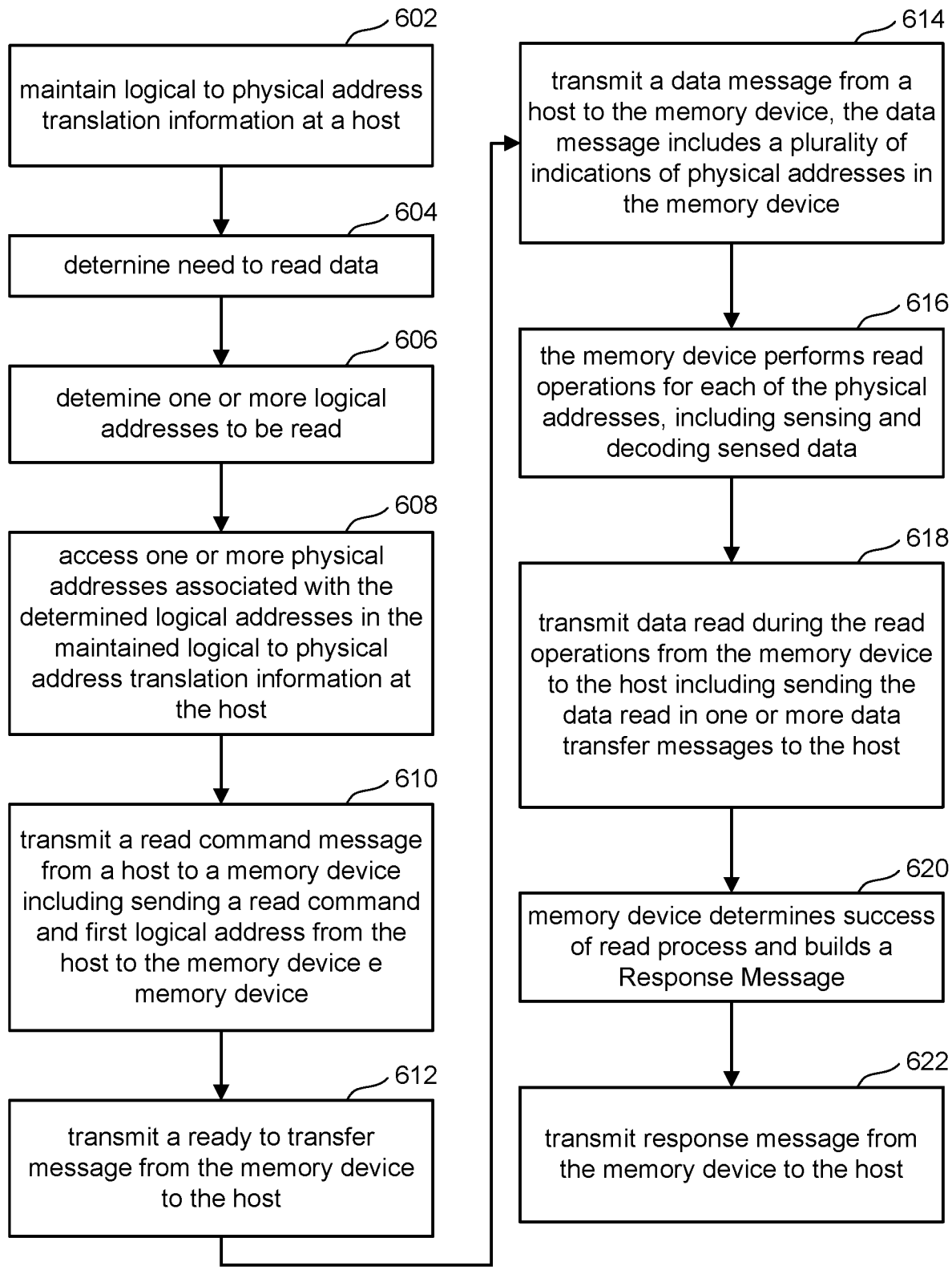
FIG. 11 is a flow chart describing one embodiment of a process for implementing a hybrid command.

FIG. 11 is a flow chart describing one embodiment of a process for implementing a hybrid command. The process of FIG. 11 is a more detailed example implementation of the process of FIG. 3, according to the data flow of FIG. 5, for implementing a hybrid HPB read command using the data structures of FIGS. 6-10. The steps of FIG. 11 are performed by host 120 and memory device 100. For example, host controller 126 or another processor on host 120 may perform the host functions while controller 102 can perform the memory device functions.

In step 602, host 120 maintains logical to physical address translation information (e.g., L2P tables 132) at the host. The logical to physical address translation information comprises a set of records each of which includes an indication of a logical address and an indication of a physical address. In one embodiment, the indications of physical addresses include physical addresses, scrambled physical addresses, encoded physical addresses or other forms of accurately representing physical addresses. In step 604, host 20 determines a need to read data. For example, application 122 may request that data be read. Consider an example where host 120 is a server and a client computer has requested that data be read from memory device 100. In step 606, host 120 determines the logical addresses for the data to be read. In some embodiments, the entity requesting the read (e.g., application 122 or an entity external to host 120) may include the logical addresses in its request to read. In some embodiments, host 120 may keep track of logical addresses for at least some data stored in memory device 100. In step 608, host 120 access one or more physical addresses associated with the determined logical addresses in the maintained logical to physical address translation information at the host. For example, host controller 126 may use the logical addresses determined in step 606 to access L2P tables 132 in host memory 130. Each logical address will correspond to a physical address entry in L2P tables 132, where the physical address entry may be the actual physical address, a scrambled version of the physical address or another derivative of the physical address, all of which are indication of the physical address.

In step 610, host 120 transmits a read command message 530 to memory device 100. The read command message includes a read command and first logical address. That read command message is received at the memory device. In step 612, memory device 100 transmits a ready to transfer message 532 to host 120. That ready to transfer message from the memory device is received at the host. In step 614, in response to the ready to transfer message, host 120 transmits a data transfer message (e.g., Data Out Transfer Message 534) to memory device 100. That data transfer message is received at memory device 100. The data transfer message includes a plurality of indications of physical addresses in the memory device; for example, the data transfer message includes multiple physical addresses (straight addresses or scrambled addresses).

In step 616, memory device 100 performs one or more read operations for each of the physical addresses, including sensing and decoding sensed data. In step 618, memory device 100 transmits the data read during the read operations from the memory device to the host 120, including sending the data read in one or more data transfer messages (e.g., Data Out Transfer Message 534) from the memory device and receiving the data read in the one or more data transfer messages at the host. In step 620, memory device 100 determines that the read process was successful and builds a Response Message 538 that indicates the successful completion of the read command. Alternatively, the read process could be partially successful or a failure and memory device will build a Response Message 538 that indicates the partial success or failure. In step 622, memory device 100 transmits the Response Message 538 from the memory device to the host, and that Response Message 538 is received at the host. Steps 612-622 are all performed in response to the read command message of step 610.

Figure 12:
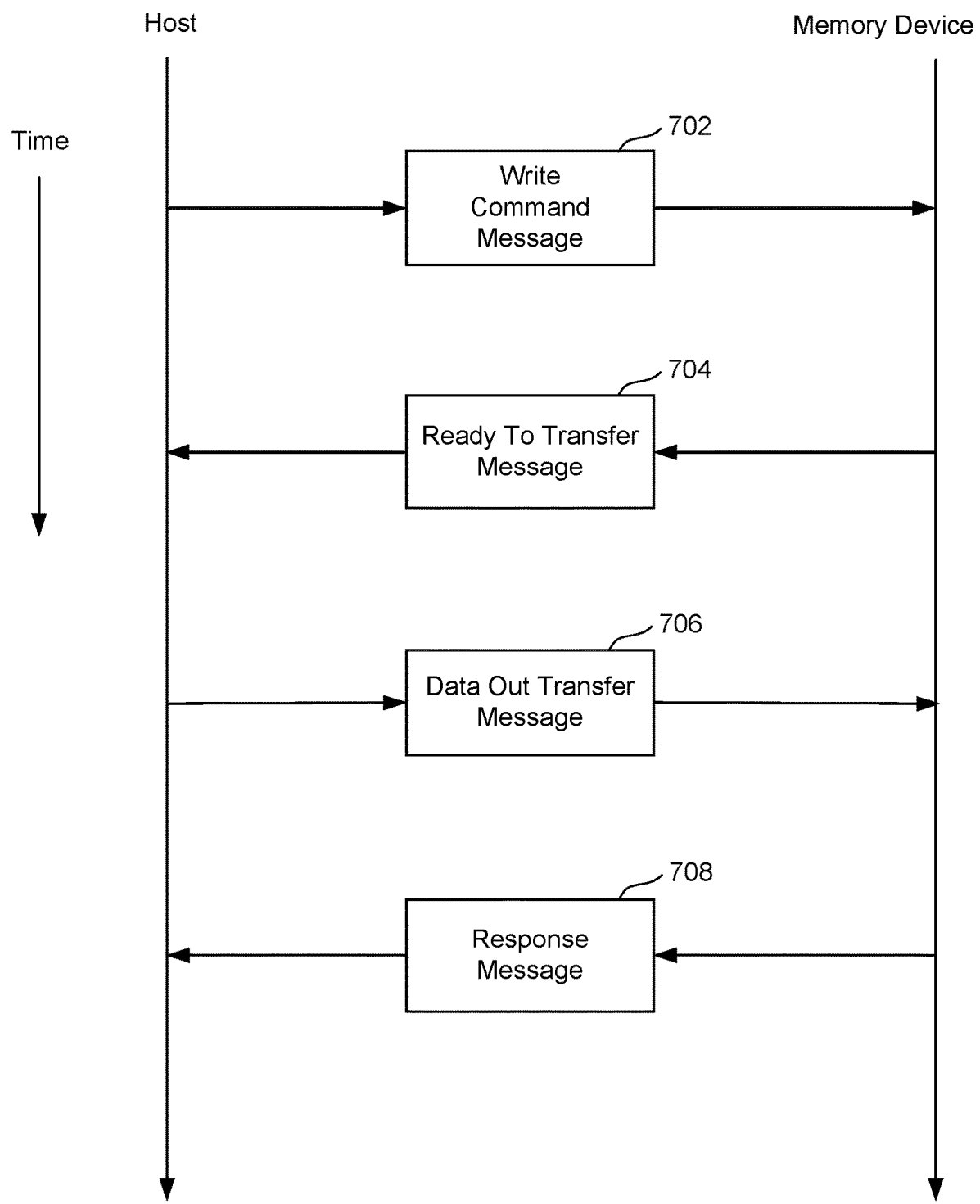
FIG. 12 is a data flow diagram describing the flow of data and messages during a write command.
Figure 13:
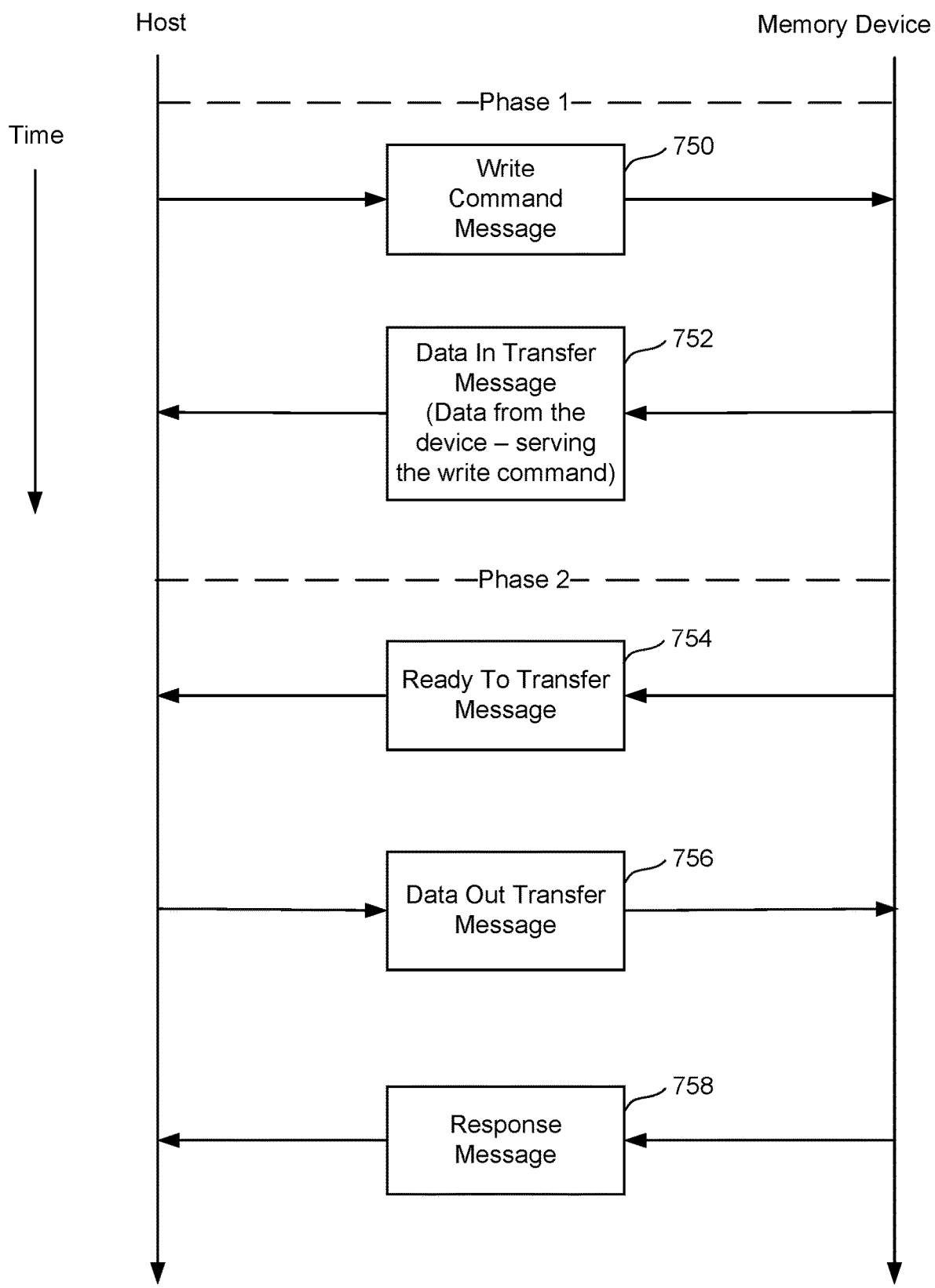
FIG. 13 is a data flow diagram describing one embodiment of the flow of data and messages during a hybrid write command.

The hybrid HPB read command is one example of a hybrid command. The proposed technology can also be used to implement other commands. For example, hybrid commands can be used to implement commands used for Replay Protected Memory Blocks (RPMB) to reduce RPMB phases. Hybrid commands can also be used to implement write commands. FIGS. 12-14 provide details of examples of implementing a hybrid command as a write command. In other embodiments, other types of commands can be implemented as a hybrid command that enables the host to both send data and receive data using a single command.

FIG. 12 is a data flow diagram describing the flow of data and messages during a write command. First, host 120 sends a Write Command Message 702 to memory device 100. Write Command Message 702 includes a standard write command (e.g., not a hybrid write command) and a logical address to store the data in the non-volatile memory 104. When memory device 100 is ready to receive the data to be written, memory device 100 transmits a Ready to Transfer Message 704 to host 120. In response, host 120 will send the data to be written into the non-volatile memory 104 in a Data Out Transfer Message 706 to memory device 100. In some cases, the amount of data to be written is too large for one Data Out Transfer Message 706; therefore, host 120 will send multiple Data Out Transfer Messages (each in response to a separate Ready to Transfer Message). After receiving the data, memory device 100 writes the data to the non-volatile memory 104 and sends a Response Message 708 to host 120.

FIG. 13 is a data flow diagram describing one embodiment of the flow of data and messages between host 120 and memory device 100 during a hybrid write command. FIG. 13 is one example embodiment representing one example implementation of the process of FIG. 3. FIG. 12 provides an example of the host sending host data to the memory device and receiving host data from the memory device using a single command. The process of FIG. 13 includes two phases. During phase 1, host 120 receives data (e.g., host data) from memory device 100. During phase 2, host 120 sends data (e.g., host data) to memory device 100. All of the messages between host 120 and memory device 100 are sent via interface 130.

First, during phase 1, host 120 sends a Write Command Message 750 to memory device 100. Write Command Message 750 includes a hybrid write command and a logical address. The data will be stored at the location in non-volatile memory that corresponds to the logical address. In Response to the Write Command Message 750, memory device 100 will send a Data In Transfer Message 752 to host 120 that includes data (e.g., host data) in service of the write command (e.g., data that the host can use as part of writing data). If memory device needs to send more data then can fit in one message, then memory device can send more than one Data In Transfer Message 752 to host 120. In one embodiment, Data In Transfer Message 752 is in the form depicted in FIG. 8. When memory device 100 is ready to receive the data to be written, memory device 100 transmits a Ready to Transfer Message 754 to host 120. In one embodiment, Ready to Transfer Message 754 is in the form depicted in FIG. 9. In response, host 120 will send the data to be written into the non-volatile memory 104 in a Data Out Transfer Message 756 to memory device 100. In some cases, the amount of data to be written is too large for one Data Out Transfer Message 756; therefore, host 120 will send multiple Data Out Transfer Messages (each in response to a separate Ready to Transfer Message). In one embodiment, Data Out Transfer Message 756 is in the form depicted in FIG. 8. After receiving the data, memory device 100 writes the data to the non-volatile memory 104 and sends a Response Message 758 to host 120. Response Message 758 provides status of the write process, such as whether the write process was successful, partially successful or a failure. Additional details can also be provided in Response Message 758. In one embodiment, Response Message 758 is in the form depicted in FIG. 10.

In one embodiment, non-volatile memory 104 comprises a plurality of memory cells, with each memory cell capable of storing multiple bits of data. In one example, a first subset of memory cells are configured to store one bit of data per memory cell and a second subset of memory cells are configured to store three bits of data per memory cell (or another amount of bits per memory cell). The memory cells that store three bits of data store data in three pages. That is each bit in a memory cell is in a different page. If the host sends three pages of data to be written, then the memory device programs the data into a group of memory cells as three bits per memory cell. In one embodiment, if the host transfers one page of data, then the memory device temporarily stores the data in a group of memory cells as one bit per memory cell. When the host sends a second page of data, then the memory device temporarily stores the second page of data in a group of memory cells as one bit per memory cell. When the host sends a third page of data, the memory cell will want to combine the three pages of data so that they can be stored in a same set of memory cells as three bits per memory cell; therefore, in response to to Write Command Message 750 for the third page of data, memory device will send the first page of data and the second page of data in one or more Data In Transfer Messages 752. The host will then combine the three pages of data and send the combined pages of data in one or more Data Out Transfer Messages 756. Thus, in this embodiment, the data in Data In Transfer Messages 752 and the data in Data Out Transfer Messages 756 are both data to be written to the non-volatile memory and are both user data and host data.

In one embodiment, the host performs its functions of FIGS. 3, 5 11 and/or 13 by executing software code stored on a non-transitory computer readable storage medium (e.g., RAM, ROM, hard disk drive, SSD, flash memory, USB memory device, etc.). The software code programs the host (e.g., programs a processor on the host) to send a hybrid command in a command message, receive a ready to transfer message, send data in a data transfer message in response to the ready to transfer message, receive data in a data transfer message, and receive a response from the memory device. The order of performance of these steps can be varied.

FIG. 14 depicts one example of the transaction specific payload 566 of the Command UPIU for Write Command Message 750. The payload includes an Op Code that indicates a hybrid write command, a Logical Address for storing the data to be written, and a Transfer Length. In one embodiment, the Transfer Length indicates the number of contiguous logical blocks of data that shall be transferred and written. In other embodiments, the Transfer Length indicates other units of data to be written (e.g., number of bytes, pages, etc.).

The above discussion introduces the hybrid command, which provides a mechanism that enables the host to send data (e.g., host data and/or user data) to the memory device and receive data (e.g., host data and/or user data) from the memory device using a single command. Because only one command is needed, the processing is more efficient and performance is increased.

One embodiment includes a method of operating a non-volatile memory device, comprising transmitting a command in a command message from a host to the non-volatile memory device (the command requests an operation such as a memory operation to be performed) and performing the command. The performance of the command comprises sending first data in a data transfer message from the host to the non-volatile memory device in response to the command, sending second data in a data transfer message from the non-volatile memory device to the host in response to the command, and the non-volatile memory device performing the operation in response to the command. The order of the steps may be varied. The data transfer message from the host to the non-volatile memory device and the data transfer message from the non-volatile memory device to the host are separate messages from the command message.

One embodiment includes a non-volatile memory device comprising non-volatile memory and a processor connected to the non-volatile memory. The processor can include a single processing unit (e.g., a microprocessor, controller, state machine, etc.) or multiple processing units. One example of a processor is a controller or a portion of a controller. The processor is configured to receive a command message from an entity external to the non-volatile memory device (the command message includes a command such as a hybrid command, the command requests an operation to be performed), perform the operation in response to the command message (including performing a memory operation [read, write, erase] on the non-volatile memory), receive data in a data transfer message from the entity external to the non-volatile memory device in response to the command, and send data in a data transfer message to the entity external to the non-volatile memory device in response to the command. The data transfer message from the entity external to the non-volatile memory device and the data transfer message to the entity external to the non-volatile memory device are separate messages from each other and from the command message. The order that functions are performed may be varied.

In one example, the command is a read command; the data in the data transfer message from the entity external to the non-volatile memory device comprises indications of multiple physical addresses in the non-volatile memory; the data in the data transfer message to the entity external to the non-volatile memory device comprises data read from the non-volatile memory using one or more of the multiple physical addresses; the entity external to the non-volatile memory device is a host connected to the non-volatile memory device by a UFS interface; the data transfer message from the entity external to the non-volatile memory device, the data transfer message to the entity external to the non-volatile memory device, and the command message are UFS UPIUs; and the processor is further configured to send the indications of multiple physical addresses to the host via a UFS UPIU.

One embodiment includes a method of operating non-volatile storage. The method comprises maintaining logical to physical address translation information at a host; transmitting a read command message from the host to a memory device including sending a read command and first logical address from the host to the memory device; transmitting a ready to transfer message from the memory device to the host; transmitting a data transfer message from the host to the memory device in response to the ready to transfer message, the data transfer message includes a plurality of indications of physical addresses in the memory device; the memory device performing read operations for the physical addresses; transmitting data read during the read operations in one or more messages from the memory device and to the host; and transmitting a response message from the memory device to the host, the response message includes status information for the operation. The logical to physical address translation information comprises a set of records each of which includes an indication of a logical address and an indication of a physical address. In some embodiments, the indications of physical addresses include scrambled physical addresses. In some embodiments, the performing read operations for each of the physical addresses includes sensing data and decoding sensed data.

One embodiment includes a non-transitory computer readable storage medium storing software code that when executing on a processor performs a method for operating a non-volatile memory device. The method comprises sending a command from a host to a memory device, the command requests an operation to be performed; sending first data from the host to the memory device in response to the command; receiving second data at the host from the memory device in response to the command; and receiving a response at the host from the memory device in response to the command, the response is sent separately from the second data. The order of the steps can be varied. The first data and the second data are transmitted separately from the command.

One embodiment includes an apparatus comprising a device interface; a memory; and means, connected to the device interface and the memory, for sending a command from a host to a memory device wherein the command requests an operation to be performed, sending first data from the host to the memory device in response to the command, receiving second data at the host from the memory device in response to the command and receiving a response at the host from the memory device in response to the command, wherein the first data and the second data are transmitted separately from the command.

In one embodiment, the means for sending a command from a host to a memory device, sending first data from the host to the memory device in response to the command, receiving second data at the host from the memory device in response to the command and receiving a response at the host from the memory device in response to the command is host controller 126 performing the processes of FIG. 3, 5, 11 or 13 using the data structures of FIGS. 6-10 and 14. In other embodiments, a general processor, microprocessor, controller, microcontroller, or state machine can be used to perform the processes of FIG. 3, 5, 11 or 13 using the data structures of FIGS. 6-10 and 14.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects. For example, the terms "first" and "second" in the phrases first data transfer message and second data transfer message are used as identification labels to distinguish the messages and are not meant to indicate an order.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:
   non-volatile memory; and
   a processor connected to the non-volatile memory, wherein the processor is configured to:
      receive a command message at the non-volatile memory device from an external entity, wherein:
         the external entity is external to the non-volatile memory device,
         the command message includes a command, and
         the command requests an operation to be performed,
      perform the operation in response to the command message, including performing a memory operation on the non-volatile memory,
      receive first host data in a data transfer message from the external entity in response to the command, wherein the processor is configured to use the first host data to perform the memory operation on the non-volatile memory, and send second host data in a data transfer message to the external entity in response to the command, wherein the processor is configured to obtain the second host data from the non-volatile memory, wherein the data transfer message from the external entity and the data transfer message to the external entity are separate messages from each other and from the command message.

2. The non-volatile memory device of claim 1, wherein: the processor is further configured to send a response message to the external entity, wherein the response message includes status information for the operation; and the response message is separate from the data transfer message from the external entity, the data transfer message to the external entity, and the command message.

3. The non-volatile memory device of claim 1, wherein: the processor is further configured to send a message to the external entity prompting the external entity to send the first host data for the command.

4. The non-volatile memory device of claim 1, wherein: the command is a read command;

the first host data in the data transfer message from the external entity comprises indications of multiple physical addresses in the non-volatile memory; and the second host data in the data transfer message to the external entity comprises data read from the non-volatile memory using one or more of the multiple physical addresses.

5. The non-volatile memory device of claim 4, wherein: the external entity is a host connected to the non-volatile memory device by a Universal Flash Storage (UFS) interface; and the data transfer message from the external entity, the data transfer message to the external entity, and the command message are UFS Protocol Information Units (UPIUs).

6. The non-volatile memory device of claim 4, wherein: the command message includes a first transfer length indication and a second transfer length indication;

the first transfer length indication indicates the amount of data to be in the data transfer message from the external entity; and the second transfer length indication indicates the amount data to be transmitted in the data transfer message to the external entity.

7. The non-volatile memory device of claim 1, wherein: the second host data comprises data to be written to the non-volatile memory.

8. The non-volatile memory device of claim 1, wherein: the first host data received in the data transfer message from the external entity comprises multiple physical addresses in the non-volatile memory.

9. The non-volatile memory device of claim 1, wherein: the first host data received in the data transfer message from the external entity comprises data to be written to the non-volatile memory.

10. The non-volatile memory device of claim 1, wherein: the command is a write command;

the first host data in the data transfer message from the external entity comprises data to be written to the non-volatile memory; and the second host data in the data transfer message to the external entity comprises data to be written to the non-volatile memory.

11. The non-volatile memory device of claim 1, wherein: the performing the operation, the receiving the first host data in the data transfer message from the external entity, and the sending the second host data in the data transfer message to the external entity all comprise the processor performing the command.

12. The non-volatile memory device of claim 1, wherein: the non-volatile memory is flash memory;

the external entity is a host configured to be connected to the non-volatile memory device by a Universal Flash Storage (UFS) interface;

the processor is a controller that is in communication with the host;

the data transfer message from the external entity is received by the controller prior to the performing the operation in response to the command message; and the controller is configured to perform the memory operation on the non-volatile memory by sending instructions to the non-volatile memory.

13. The non-volatile memory device of claim 1, wherein: the command is a read command;

the processor is further configured to transmit a ready to transfer message from the memory device to the host in response to the read command, the received data transfer message from the external entity is in response to the ready to transfer message;

the first host data in the data transfer message from the external entity comprises a plurality of indications of multiple physical addresses in the non-volatile memory; and the second host data in the data transfer message to the external entity comprises data read from the non-volatile memory using one or more of the multiple physical addresses.

14. A method of operating non-volatile storage, the method comprising:

maintaining logical to physical address translation information at a host, wherein the logical to physical address translation information comprises a set of records each of which includes an indication of a logical address and an indication of a physical address;

transmitting a read command message from the host to a memory device including sending a read command from the host to the memory device;

transmitting a ready to transfer message from the memory device to the host in response to the read command;

transmitting a data transfer message from the host to the memory device in response to the ready to transfer message and the read command, wherein the data transfer message includes a plurality of indications of physical addresses in the memory device;

the memory device performing read operations for the physical addresses of the data transfer message in response to the read command;

transmitting data read during the read operations in one or more messages from the memory device to the host; and transmitting a response message from the memory device to the host, wherein the response message includes status information for the operation.

15. The method of claim 14, wherein:
the host is connected to the memory device by a Universal Flash Storage (UFS) interface; and the read command message, the ready to transfer message, the data transfer message from the host, the one or more messages from the memory device, and the response message are UFS Protocol Information Units (UPIUs).

16. The method of claim 14, wherein:
the transmitting the data transfer message from the host to the memory device includes transmitting logical to physical address translation information from the memory device to the host.

17. An apparatus, comprising:
a device interface;
a memory; and
means, connected to the device interface and the memory, for:
  sending a command from a host to a memory device wherein the command requests a memory operation to be performed on non-volatile memory of the memory device,
  sending first host data from the host to the memory device in response to the command, wherein the first host data pertains to the memory operation on the non-volatile memory,
  receiving second host data at the host from the memory device in response to the command, wherein the second host data pertains to the memory operation on the non-volatile memory, and
  receiving a response at the host from the memory device in response to the command, wherein the first host data and the second host data are transmitted separately from the command.

18. The apparatus of claim 17, wherein:
the command is a read command;
the first host data comprises indications of multiple physical addresses in the non-volatile memory;
the second host data comprises data read from the non-volatile memory using one or more of the multiple physical addresses;
the sending the command and sending the first host data comprise sending Universal Flash Storage (UFS) Protocol Information Units (UPIUs); and
the memory is configured to store logical to physical address translation information, wherein the logical to physical address translation information comprises a set of records each of which includes an indication of a logical address and an indication of a physical address.

19. The apparatus of claim 17, wherein:
the command includes a first transfer length indication and a second transfer length indication;
the first transfer length indication indicates an amount of data to be transmitted for the first host data; and
the second transfer length indication indicates an amount data to be transmitted for the second host data.

20. The apparatus of claim 17, wherein:
the command is a hybrid command; and
the means for sending the hybrid command further includes means for sending a standard command from the host to the memory device, wherein the standard command requests a memory operation to be performed with host data being sent from one of either the host to the memory device or the memory device to the host but host data is not to be sent both from the host to the memory device and from the memory device to the host.

* * * * *